(12) United States Patent
Lu et al.

(10) Patent No.: US 7,544,616 B2
(45) Date of Patent: Jun. 9, 2009

(54) METHODS OF FORMING NITRIDE READ ONLY MEMORY AND WORD LINES THEREOF

(75) Inventors: Chi-Pin Lu, Hsinchu (TW); Ling-Wu Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 48 days.

(21) Appl. No.: 11/874,061

(22) Filed: Oct. 17, 2007

(65) Prior Publication Data

US 2009/0061609 A1 Mar. 5, 2009

(30) Foreign Application Priority Data

Sep. 3, 2007 (TW) ............... 96132738 A

(51) Int. Cl.
*H01L 21/4763* (2006.01)
*H01L 21/44* (2006.01)
(52) U.S. Cl. .............. 438/682; 438/630; 438/649; 438/655; 438/664; 438/669; 438/721; 438/755; 257/E21.199; 257/E21.165; 257/E21.438; 257/E21.657; 257/E21.658
(58) Field of Classification Search .......... 257/E21.165, 257/E21.199, E21.438, E21.657, E21.658
See application file for complete search history.

(56) References Cited

U.S. PATENT DOCUMENTS

| | | | |
|---|---|---|---|
| 5,643,633 A | 7/1997 | Telford et al. | |
| 5,804,499 A | 9/1998 | Dehm et al. | |
| 5,997,950 A | 12/1999 | Telford et al. | |
| 6,410,428 B1 | 6/2002 | Chiang et al. | |
| 7,414,282 B2 * | 8/2008 | Ho et al. | 257/314 |
| 2007/0138599 A1 * | 6/2007 | Ahn et al. | 257/618 |

FOREIGN PATENT DOCUMENTS

| | | |
|---|---|---|
| TW | 416110 | 12/2000 |
| TW | 469517 | 12/2001 |

* cited by examiner

*Primary Examiner*—Walter L Lindsay, Jr.
*Assistant Examiner*—Mohsen Ahmadi
(74) *Attorney, Agent, or Firm*—J.C. Patents

(57) ABSTRACT

A method of forming word lines of a memory includes providing a substrate and forming a conductive layer on the substrate. A metal silicide layer is formed on the conductive layer, and a mask pattern is formed on the metal silicide layer. A mask liner covering the mask pattern and the surface of the metal silicide layer is formed on the substrate to shorten distances between the word line regions. An etching process is performed on the mask liner and the mask pattern until the partial surface of the metal silicide layer is exposed. The metal silicide layer and the conductive layer are etched to form word lines by utilizing the mask liner and the mask pattern as a mask. A silicon content of the metal silicide layer must be less than or equal to 2 for reducing a bridge failure rate between the word lines.

14 Claims, 8 Drawing Sheets

METHODS OF FORMING NITRIDE READ ONLY MEMORY AND WORD LINES THEREOF

CROSS-REFERENCE TO RELATED APPLICATION

This application claims the priority benefit of Taiwan application serial no. 96132738, filed on Sep. 3, 2007. All disclosure of the Taiwan application is incorporated herein by reference.

BACKGROUND OF THE INVENTION

1. Field of the Invention

The present invention relates to a nitride read only memory (NBit) technology, and more particularly, to methods of forming an NBit and word lines thereof.

2. Description of Related Art

An NBit is a memory which stores data through charge trapping. A typical NBit unit may have two separate charge bits, and thus each unit has doubled memory density. In addition, to satisfy requirements for applying the NBit in the next generation, a dimension of a conventional NBit is required to be decreased continuously. Thus, a liner is further developed nowadays to be deposited on a surface of a hard mask, such that a space between two devices is reduced.

However, in a sub-micron generation (e.g. a 0.1 μm or a 0.075 μm), the above-identified method for reducing the space between the devices results in an increase in a bridge failure rate between word lines.

SUMMARY OF THE INVENTION

The present invention is directed to a method of forming word lines of a memory. The method is capable of reducing a bridge failure rate between the word lines.

The present invention is further directed to a method of forming an NBit, so as to satisfy electrical requirements in a sub-micron generation.

The present invention provides a method of forming word lines of a memory. In the method, a substrate is firstly provided, and then a conductive layer is formed on the substrate. Next, a metal silicide layer is formed on the conductive layer, and a mask pattern is formed on the metal silicide layer to define a plurality of word line regions and expose a partial surface of the metal silicide layer. Afterwards, a mask liner covering the mask pattern and the surface of the metal silicide layer is formed on the substrate to shorten distances between the word line regions. Thereafter, an etching process is performed on the mask liner and the mask pattern until the partial surface of the metal silicide layer is exposed, and the metal silicide layer and the conductive layer are etched to form a plurality of the word lines by utilizing the mask liner and the mask pattern as a mask. A silicon content of the metal silicide layer is ensured to be less than or equal to 2 for reducing a bridge failure rate between the word lines.

The present invention further provides a method of forming word lines of a memory. In the method, a substrate having a conductive layer is firstly provided, and a metal silicide layer is formed on the conductive layer, wherein a silicon content of the metal silicide layer is less than or equal to 2. Next, a mask pattern is formed on the metal silicide layer to define a plurality of word line regions and expose a partial surface of the metal silicide layer. Afterwards, a plurality of mask liners is formed on sidewalls of the word line regions. Thereafter, the metal silicide layer and the conductive layer are etched to form a plurality of the word lines by utilizing the mask liners and the mask pattern as a mask.

According to an embodiment of the present invention, the metal silicide layer includes a WSix (tungsten silicide) layer, a CoSix (cobalt silicide) layer or a TiSix (titanium silicide) layer. Moreover, the step of forming the metal silicide layer includes performing a low pressure chemical vapor deposition (LPCVD) process. Here, the LPCVD process includes taking dichlorosilane (DCS) as a source gas of silicon and taking $WF_6$ as a source gas of tungsten.

According to an embodiment of the present invention, the x in the WSix layer ranges from 1.9 to 2.

According to an embodiment of the present invention, a step of forming the mask pattern includes performing a chemical vapor deposition (CVD) process to form an oxide layer on the metal silicide layer. After that, photolithography and etching processes are performed, such that the oxide layer becomes an oxide pattern of the exposed partial surface of the metal silicide layer.

According to an embodiment of the present invention, the step of forming the mask liner includes performing the LPCVD process to deposit an oxide film when a reactive gas is defined as tetra-ethyl-ortho-silicate (TEOS), or performing an etching back after formation of the oxide film.

According to an embodiment of the present invention, a material of the conductive layer includes doped polysilicon.

According to an embodiment of the present invention, a protective thin film is formed on sidewalls of the word lines respectively after the word lines are formed.

The present further provides a method of forming an NBit. In the method, a substrate is provided at first, and a plurality of charge trapping layers is formed on the substrate. Thereafter, a plurality of bit lines is formed in the substrate at respective sides of the charge trapping layers. Next, a conductive layer and a metal silicide layer are sequentially formed on the substrate, and a mask pattern is formed on the metal silicide layer to define a plurality of word line regions and expose a partial surface of the metal silicide layer. Afterwards, a mask liner covering the mask pattern and the surface of the metal silicide layer is formed on the substrate to shorten distances between the word line regions. After that, an etching process is performed on the mask liner and the mask pattern until the partial surface of the metal silicide layer is exposed, and the metal silicide layer and the conductive layer are etched to form a plurality of word lines by utilizing the mask liner and the mask pattern as a mask. A silicon content of the metal silicide layer is ensured to be less than or equal to 2 for reducing a bridge failure rate between the word lines.

According to another embodiment of the present invention, the metal silicide layer includes a WSix (tungsten silicide) layer, a CoSix (cobalt silicide) layer or a TiSix (titanium silicide) layer. Moreover, the step of forming the metal silicide layer includes performing an LPCVD process in which DCS is taken as a source gas of silicon and $WF_6$ is taken as a source gas of tungsten, for example.

According to another embodiment of the present invention, the x in the WSix layer ranges from 1.9 to 2.

According to another embodiment of the present invention, a step of forming the mask pattern includes performing a CVD process to form an oxide layer on the metal silicide layer. After that, photolithography and etching processes are performed, such that the oxide layer becomes an oxide pattern of the exposed partial surface of the metal silicide layer.

According to another embodiment of the present invention, the step of forming the mask liner includes performing the LPCVD process to deposit an oxide film when a reactive gas is defined as TEOS.

According to another embodiment of the present invention, a material of the conductive layer includes doped polysilicon.

According to another embodiment of the present invention, a step of forming the charge trapping layers on the substrate includes forming a stacked structure on the substrate at first. The stacked structure formed on the substrate includes a first oxide layer (O1), a first nitride layer (N1), a second oxide layer (O2), a second nitride layer (N2), and a third oxide layer (O3) from bottom to top. After that, the photolithography and etching processes are performed, such that the stacked structure becomes the charge trapping layers.

According to another embodiment of the present invention, a protective thin film is formed on sidewalls of the word lines respectively after the word lines are formed.

In the present invention, a stoichiometric metal silicide is employed. Hence, even though the mask liner formed by thermal oxidation is used in the present invention, a metal-Si—O compound is not formed because of additional silicon in the metal silicide layer. As such, when the etching process is performed to form the word lines, the metal silicide layer and the conductive layer disposed under the metal silicide layer can be completely removed without being affected by the metal-Si—O compound.

In order to make the aforementioned and other objects, features and advantages of the present invention more comprehensible, several embodiments accompanied with figures are described in detail below.

BRIEF DESCRIPTION OF THE DRAWINGS

FIG. 3F is a top view illustrating the fabrication process of the NBit according to the second embodiment of the present invention.

DESCRIPTION OF EMBODIMENTS

The present invention will now be described with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In addition, for the purpose of clarity, dimensions of each layer and of each regions are not illustrated according to actual proportions.

FIGS. 1A through 1F are schematic cross-sectional flowcharts illustrating formations of word lines of a memory according to a first embodiment of the present invention.

Figure 1A:
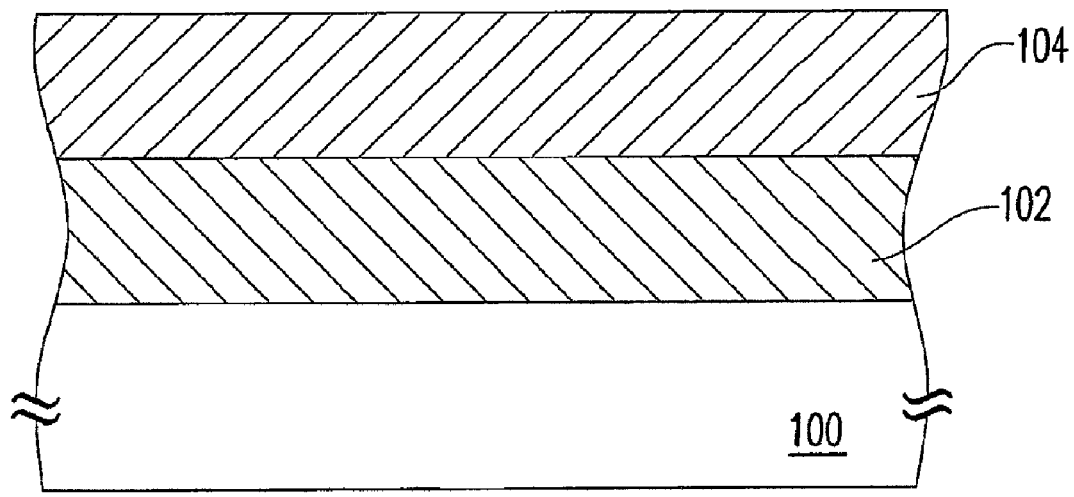
FIGS. 1A through 1F are schematic cross-sectional flowcharts illustrating formations of word lines of a memory according to a first embodiment of the present invention.

Referring to FIG. 1A, a substrate 100 is provided. Here, the "substrate" in the first embodiment may be a substrate having bit lines and charge storage layers formed therein. For example, given that the memory of the first embodiment is an NBit, bit lines and charge trapping layer should have been formed in the substrate. Next, a conductive layer 102 is formed on the substrate 100. The conductive layer 102 is made of doped polysilicon or other appropriate conductive materials, for example, and a thickness of the conductive layer 102 may be defined in a range from 500 Å to 700 Å based on actual design demands of devices. Thereafter, a metal silicide layer 104 is formed on the conductive layer 102. A silicon content of the metal silicide layer 104 is less than or equal to 2, preferably in a range from 1.9 to 2. For example, the metal silicide layer 104 is an refractory metal silicide layer such as a WSix (tungsten silicide) layer, a CoSix (cobalt silicide) layer, a TiSix (titanium silicide) layer or other suitable refractory metal silicide layer. Besides, a thickness of the metal silicide layer 104 approximately ranges from 800 Å to 1000 Å based on the actual design demands of the devices, for example.

Referring to FIG. 1A, when the metal silicide layer 104 is a WSix layer, the step of forming the metal silicide layer 104 includes performing an LPCVD process at approximately 520° C.~580° C., for example. Additionally, in the LPCVD process, DCS is taken as a source gas of silicon, while $WF_6$ is taken as a source gas of tungsten. Under said condition, a DCS flow in a range from 180 sccm to 220 sccm and a $WF_6$ flow in a range from 4.2 seem to 4.8 seem may be determined.

Figure 1B:
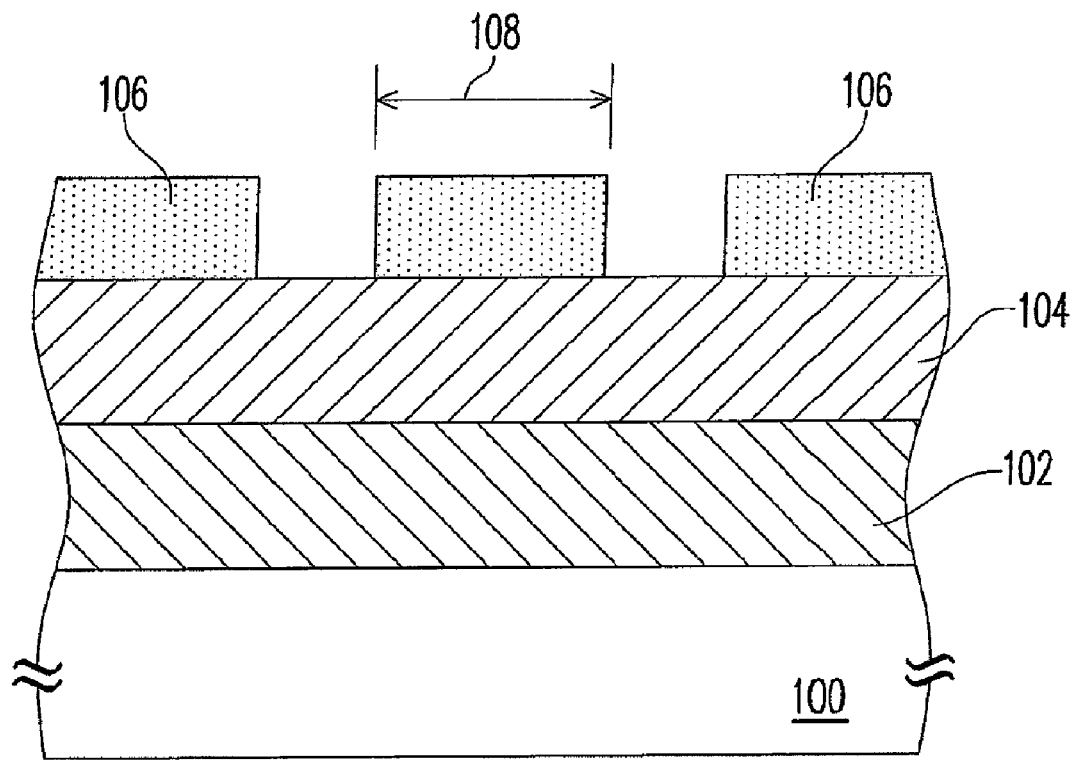
Figure 1C:
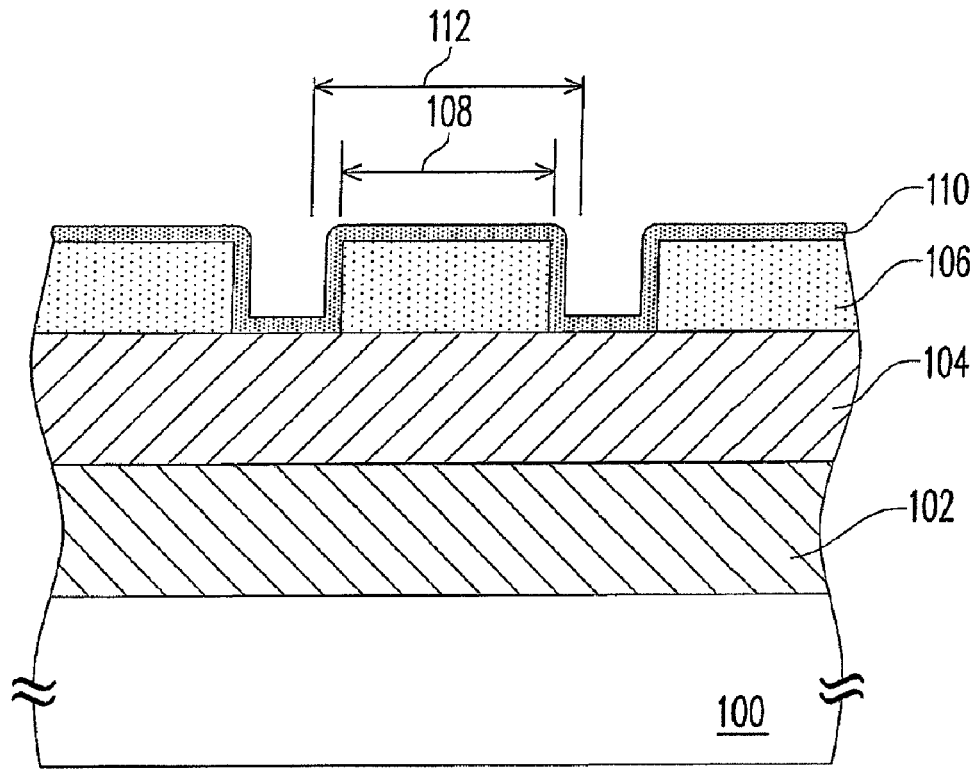

Next, referring to FIG. 1B, a mask pattern 106 is formed on the metal silicide layer 104 to define a plurality of word line regions 108 and expose a partial surface of the metal silicide layer 104. Here, a step of forming the mask pattern 106 includes performing a CVD process to form an oxide layer on the metal silicide layer 104. After that, photolithography and etching processes are performed, such that the oxide layer becomes an oxide pattern (i.e. the mask pattern 106) of the exposed partial surface of the metal silicide layer 104. Note that the "photolithography and etching processes" in the present invention refers to both the photolithography process and the etching process. For example, a patterned photoresist layer formed by implementing the photolithography process may be adopted as a mask to perform the etching process. After that, with reference to FIG. 1C, a mask liner 110 covering the mask pattern 106 and the surface of the metal silicide layer 104 are formed on the substrate 100. A method of forming the mask liner 110 is, for example, performing the LPCVD process to deposit an oxide film when a reactive gas is defined as TEOS. Since the x in the metal silicide layer 104 of the first embodiment is less than or equal to 2, no additional Si may be reacted with oxygen when the mask liner 110 is formed, thereby reducing a bridge failure rate between the word lines. On the other hand, the mask liner 110 in FIG. 1C conformally covers the mask pattern 106, such that the original word line regions 108 are enlarged to form regions 112. Thereby, distances between the subsequently-formed word line regions may be correspondingly shortened, and spaces among the devices are further reduced. In other words, the spaces among the devices can be reduced by controlling thicknesses of the mask pattern 106 and the mask liner 110.

According to the first embodiment, line width ranges of the word line regions 108 and 112 respectively corresponding to the mask pattern 106 and the mask liner 110 are taken for examples and are indicated in the following Table 1. Besides, the line width ranges comply with those of the word lines in the next generation (a width of 0.075 μm).

TABLE 1

| Word line region 108 | Word line region 112 |
|---|---|
| 0.075~0.105 μm | 0.095~0.125 μm |

Figure 1D:
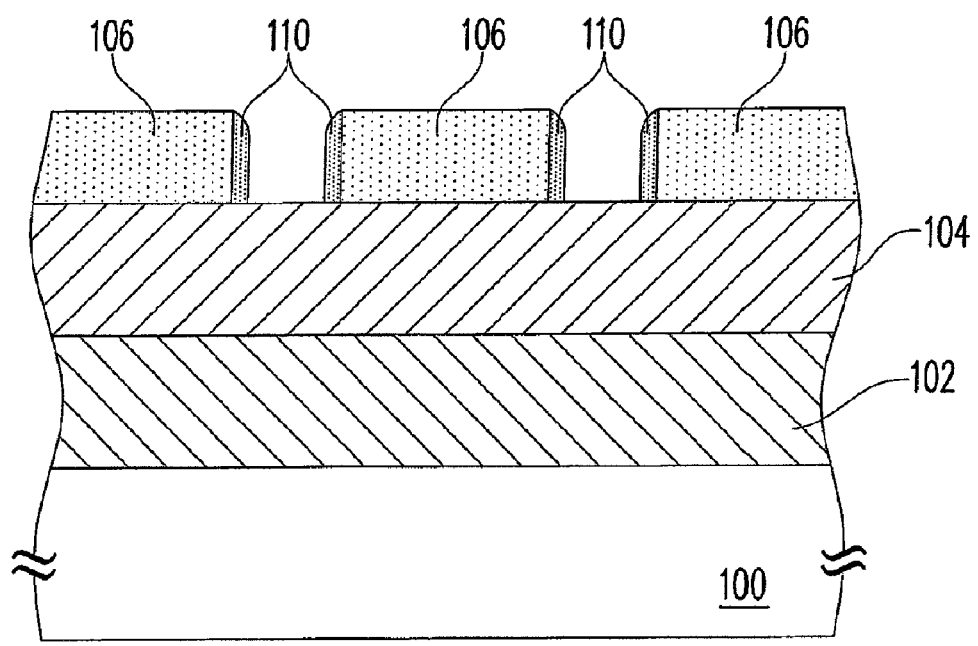

Next, referring to FIG. 1D, the etching process is performed on the mask liner 110 and the mask pattern 106 until the partial surface of the metal silicide layer 104 is exposed. At this time, the mask liner 110 is thinned down slightly.

Figure 1E:
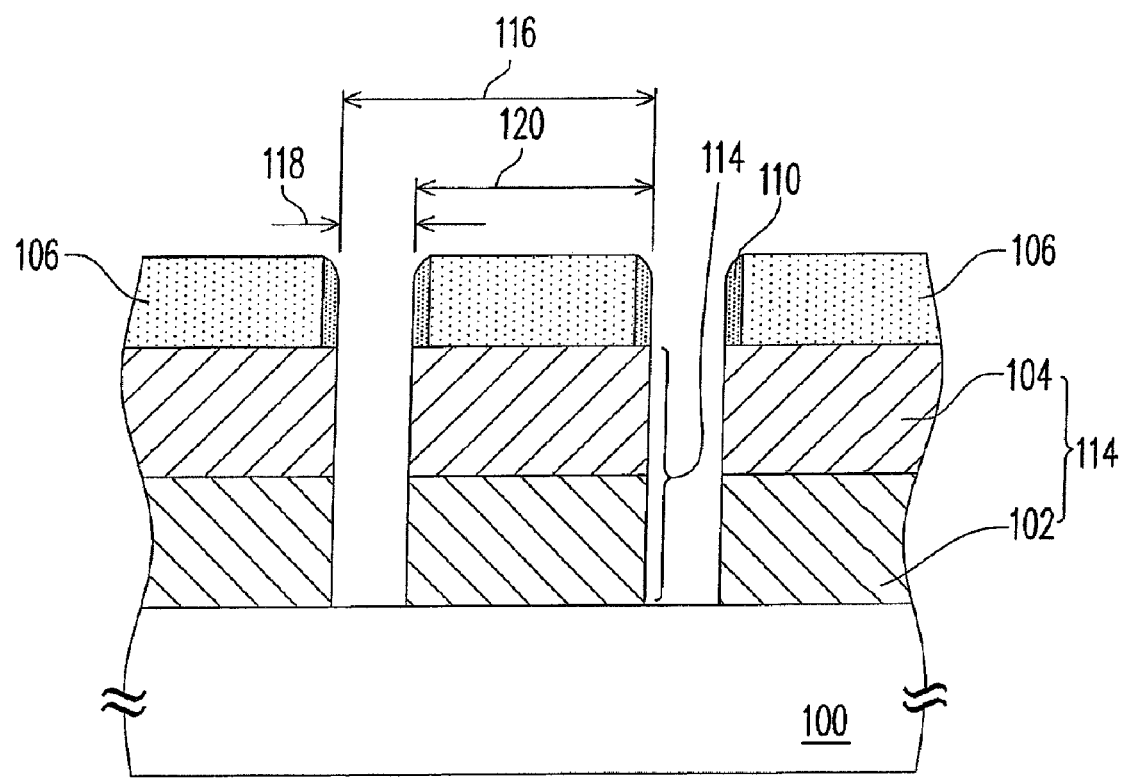

Then, referring to FIG. 1E, the metal silicide layer 104 and the conductive layer 102 are etched to form a plurality of word lines 114 by utilizing the mask liner 110 and the mask pattern 106 as the mask. According to the line width ranges of the mask pattern 106 and the mask liner 110 shown in Table 1, ranges of a pitch 116, a space 118 and a width 120 of the word lines 114 are obtained and indicated in the following Table 2. It is known from Table 2 that the space less than or equal to 0.075 μm may be achieved according to the first embodiment.

TABLE 2

| Pitch 116 | Space 118 | Width 120 |
|---|---|---|
| 0.120~0.180 μm | 0.045~0.075 μm | 0.075~0.105 μm |

Figure 1F:
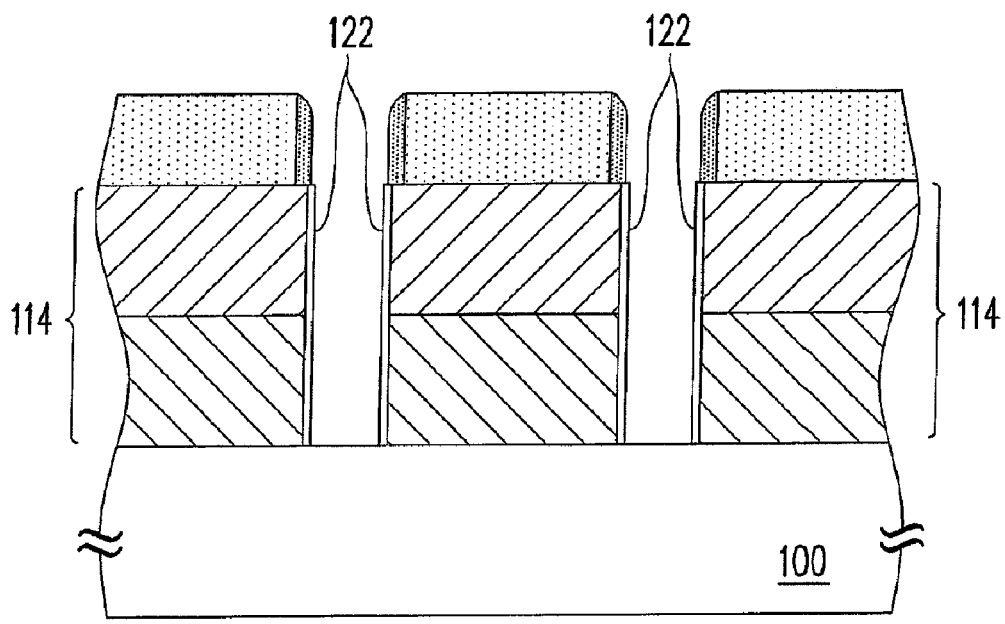

Afterwards, referring to FIG. 1F, a protective thin film 122 may be alternatively formed respectively on sidewalls of the word lines 114 after the word lines 114 are formed.

An experiment of the first embodiment and a control experiment thereof are provided hereinafter to evidence functions of the present invention.

Experiment

First of all, a doped polysilicon layer having a thickness of about 600 Å and a metal silicide layer having the thickness of around 900 Å are formed on the substrate in sequence. Here, when the metal silicide layer is a WSix layer, the metal silicide layer is formed by utilizing an LPCVD reactor, such as Centura fabricated by Applied Material, Inc., and the LPCVD process is formed at approximately 550° C. with a pressure of approximately 1.2 Torr. The reactive gases include DCS ($SiH_2Cl_2$) having a flow of around 200 sccm and $WF_6$ having a flow around 4.5 sccm. The x in the WSix layer deposited in the experimental example is 2 approximately. Thereafter, the word lines indicated in Table 2 are formed through the method described in the first embodiment.

Control Experiment

All the steps performed in the comparative example are identical to those implemented in the experimental example except for the step that the WSix layer is formed by performing a conventional process. Therefore, the x in the WSix layer is approximately 2.3.

Figure 2:
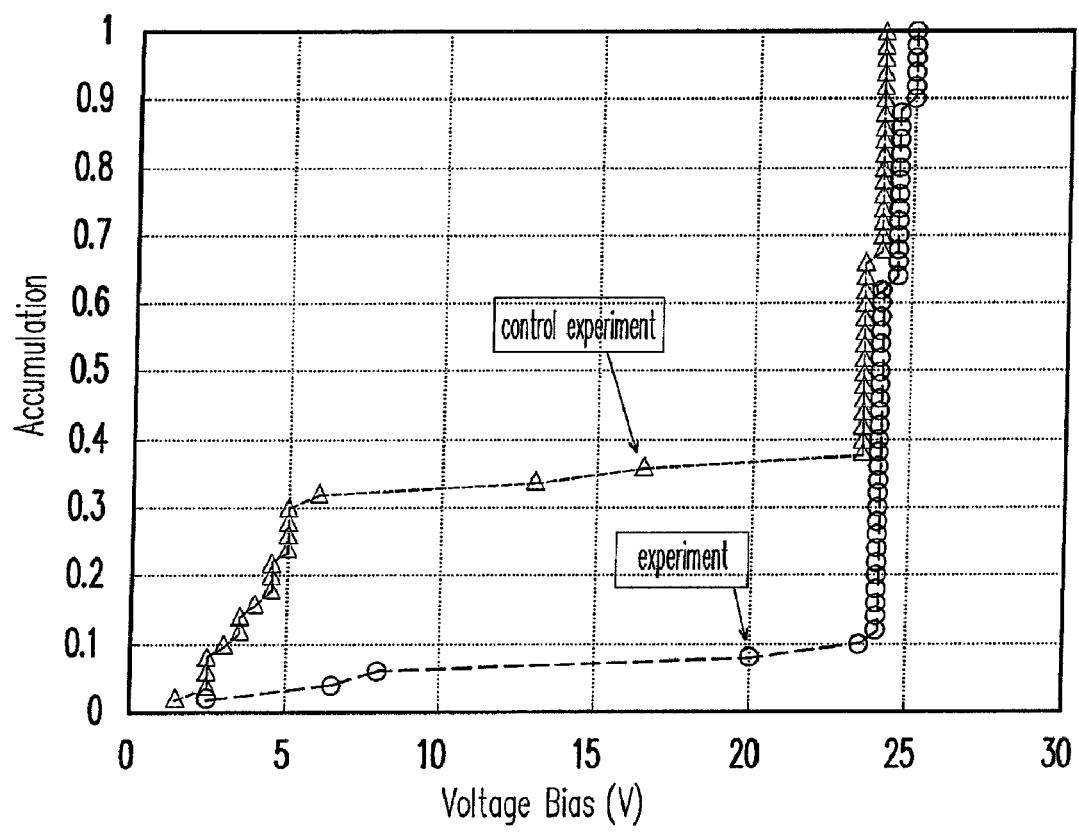
FIG. 2 is a curve illustrating an electrical test conducted in an experiment and in a control experiment according to the first embodiment.

FIG. 2 is a curve illustrating an electrical test conducted in the experiment and in the control experiment according to the first embodiment. Referring to FIG. 2, in the electrical test, a voltage bias is supplied between the word lines and the substrate, and a current is then measured. In general, as the voltage bias exceeds 20V but the current is less than 10 μA, the electrical test is "passed". Thus, it is known from FIG. 2 that in the experiment of the first embodiment, the electrical test is passed, whereas the current is significantly increased when the voltage bias is 5V in the control experiment.

Figure 3A:
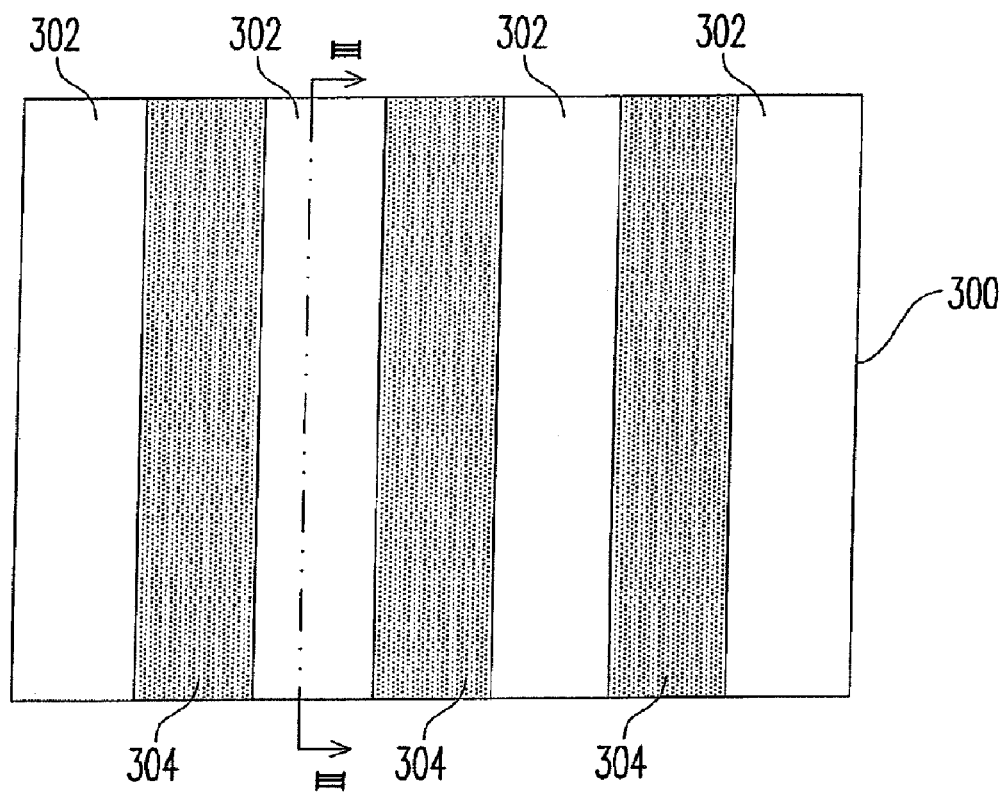
FIG. 3A is a top view illustrating a fabricating process of an NBit according to a second embodiment of the present invention.

FIG. 3A is a top view illustrating a fabricating process of an NBit according to a second embodiment of the present invention. FIGS. 3B through 3F following a line segment III-III in FIG. 3A are cross-sectional flowcharts illustrating the fabrication process of the NBit. FIG. 3G following FIG. 3F is a top view illustrating the fabrication process of the NBit.

Referring to FIG. 3A, a substrate 300, such as a semiconductor substrate including a silicon substrate or the like, is provided. Next, a plurality of charge trapping layers 302 is formed on the substrate 300, and a plurality of bit lines 304 is then formed in the substrate 300 at respective sides of the charge trapping layers 302.

Figure 3B:
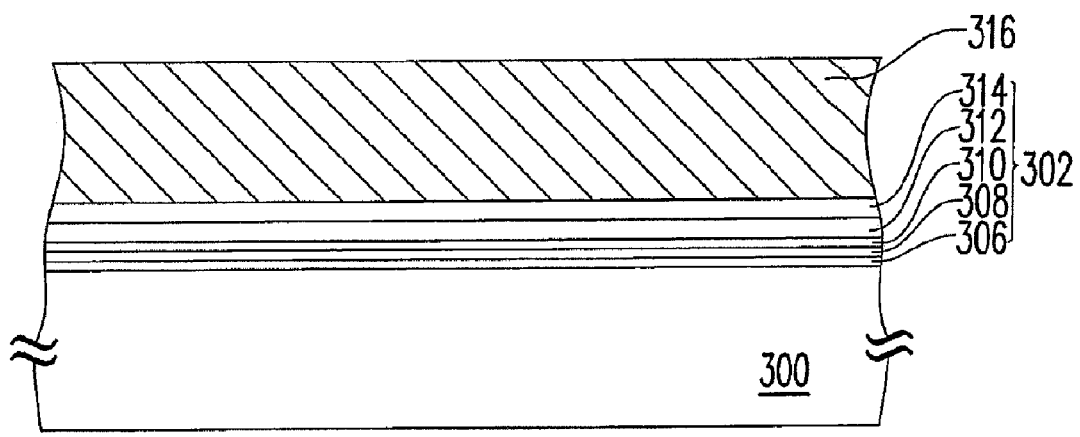
FIGS. 3B through 3F following FIG. 3A are cross-sectional flowcharts illustrating the fabrication process of the NBit according to the second embodiment of the present invention.

Thereafter, please refer to FIG. 3B. The charge trapping layers 302 depicted in FIG. 3A may be fabricated through various currently-existing technologies, and thus the cross-sectional view of the charge trapping layers 302 are taken to elaborate the present invention. It is apparent in FIG. 3B that each charge trapping layer 302 is a stacked structure formed on the substrate 300. The stacked structure includes a first oxide layer (O1) 306, a first nitride layer (N1) 308, a second oxide layer (O2) 310, a second nitride layer (N2) 312, and a third oxide layer (O3) 314 from bottom to top. Besides, the stacked structure (i.e. the charge trapping layer 302) is formed by performing several deposition processes. After that, the photolithography and the etching processes are implemented to form the plurality of the stripe-shaped charge trapping layers 302 as shown in FIG. 3A. Here, as a thickness of the first oxide layer 306 is approximately less than 2 nm, in a range from 0.5 nm to 2 nm, or less than 1.5 nm. A thickness of the first nitride layer 308 is approximately less than 2 nm or in a range from 1 nm to 2 nm. Furthermore, a thickness of the second oxide layer 310 is approximately less than 2 nm or in a range from 1.5 nm to 2 nm. Thereafter, a complete conductive layer 316 is formed on the charge trapping layers 302. A material of the conductive layer 316 is, for example, doped polysilicon or other appropriate conductive materials, while a thickness thereof is determined upon the actual design demands of the devices.

Figure 3C:
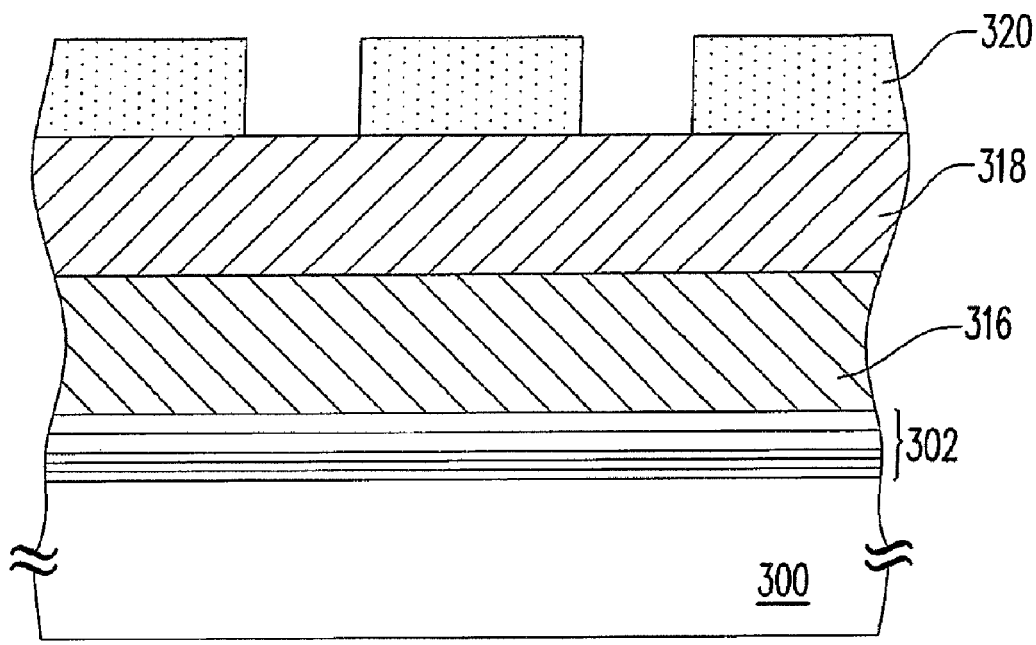

Afterwards, referring to FIG. 3C, a metal silicide layer 318 is formed on the conductive layer 316. For example, the metal silicide layer 318 is an refractory metal silicide layer such as a WSix (tungsten silicide) layer, a CoSix (cobalt silicide) layer or a TiSix (titanium silicide) layer. A silicon content of the metal silicide layer 318 is less than or equal to 2, while a thickness of the metal silicide layer 318 is determined upon the actual design demands of the devices. Moreover, when the metal silicide layer 318 is a WSix layer, an x is preferably in a range from 1.9 to 2. The method of forming the metal silicide layer 318 may be the same as that provided in the first embodiment or as any other appropriate fabricating methods. Next, a mask pattern 320 is formed on the metal silicide layer 318 to expose a partial surface of the metal silicide layer 318. The step of forming the mask pattern 320 may be the same as that described in the first embodiment.

Figure 3D:
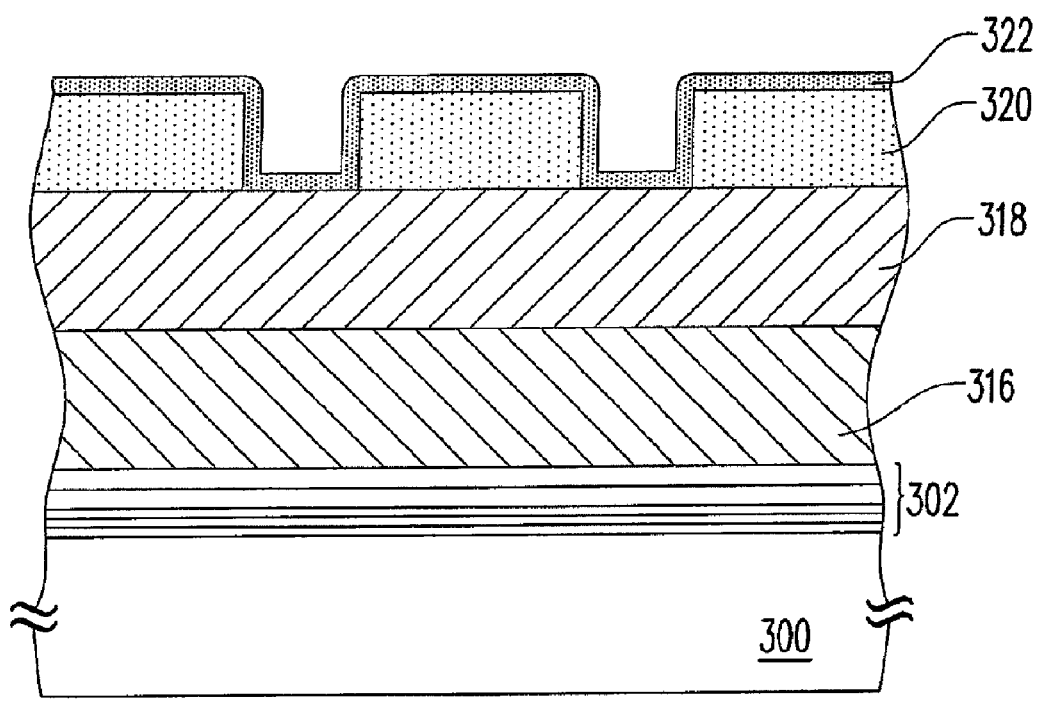

After that, referring to FIG. 3D, a mask liner 322 covering the mask pattern 320 and the surface of the metal silicide layer 318 is formed on the substrate 300, so as to shorten distances between the subsequently-formed word lines. The method of forming the mask liner 322 may be the same as that described in the first embodiment.

Figure 3E:
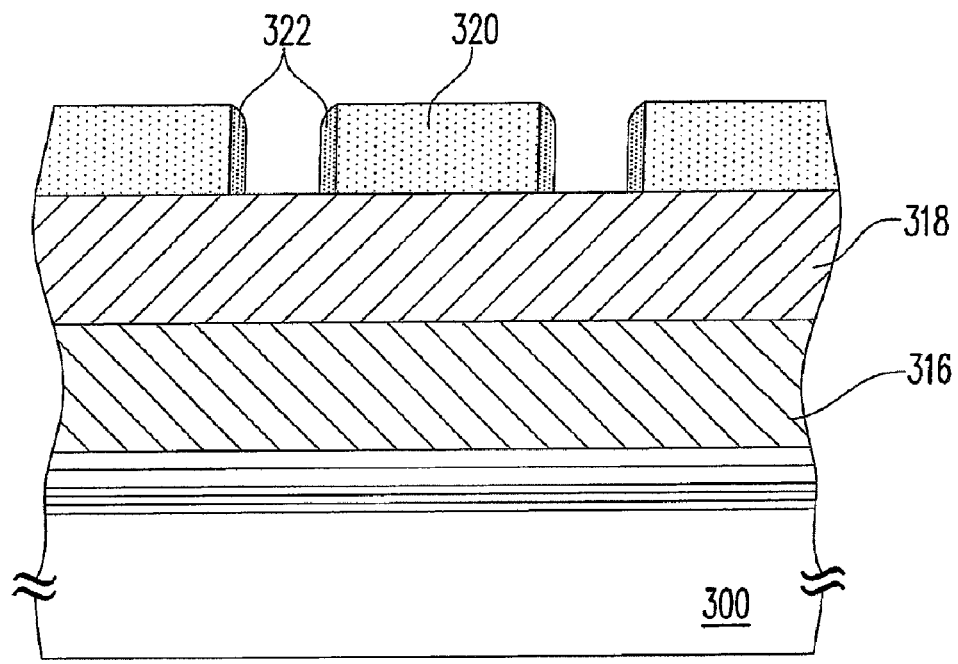
Figure 3F:
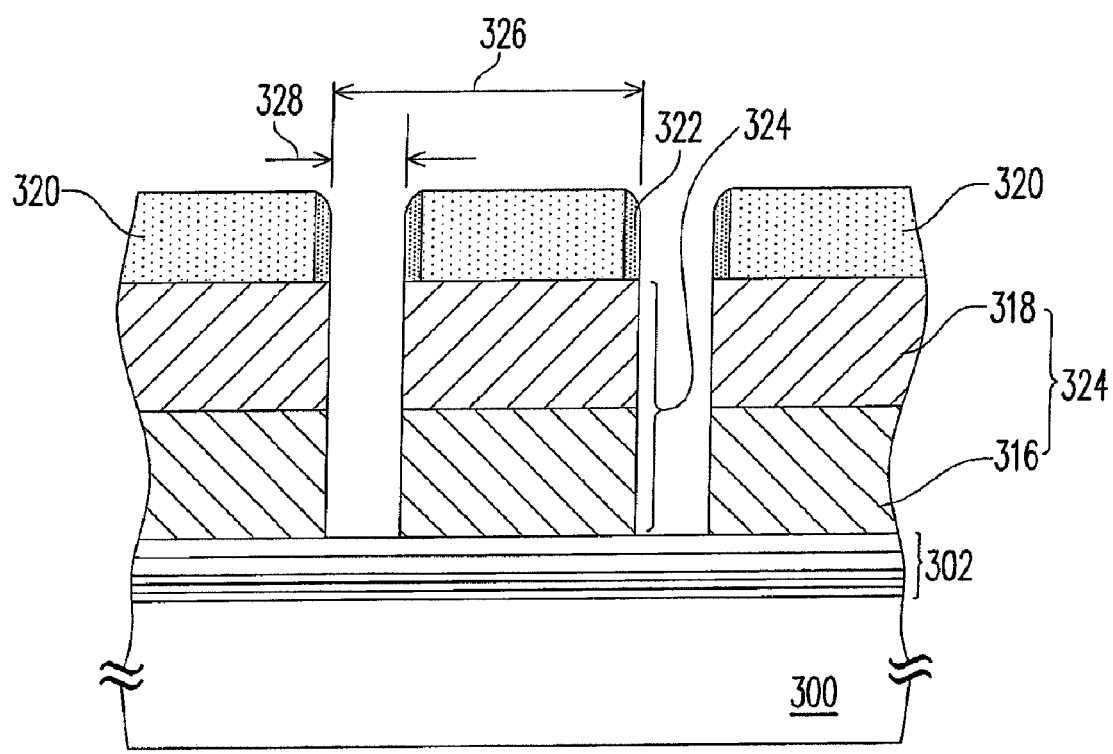
Figure 3G:
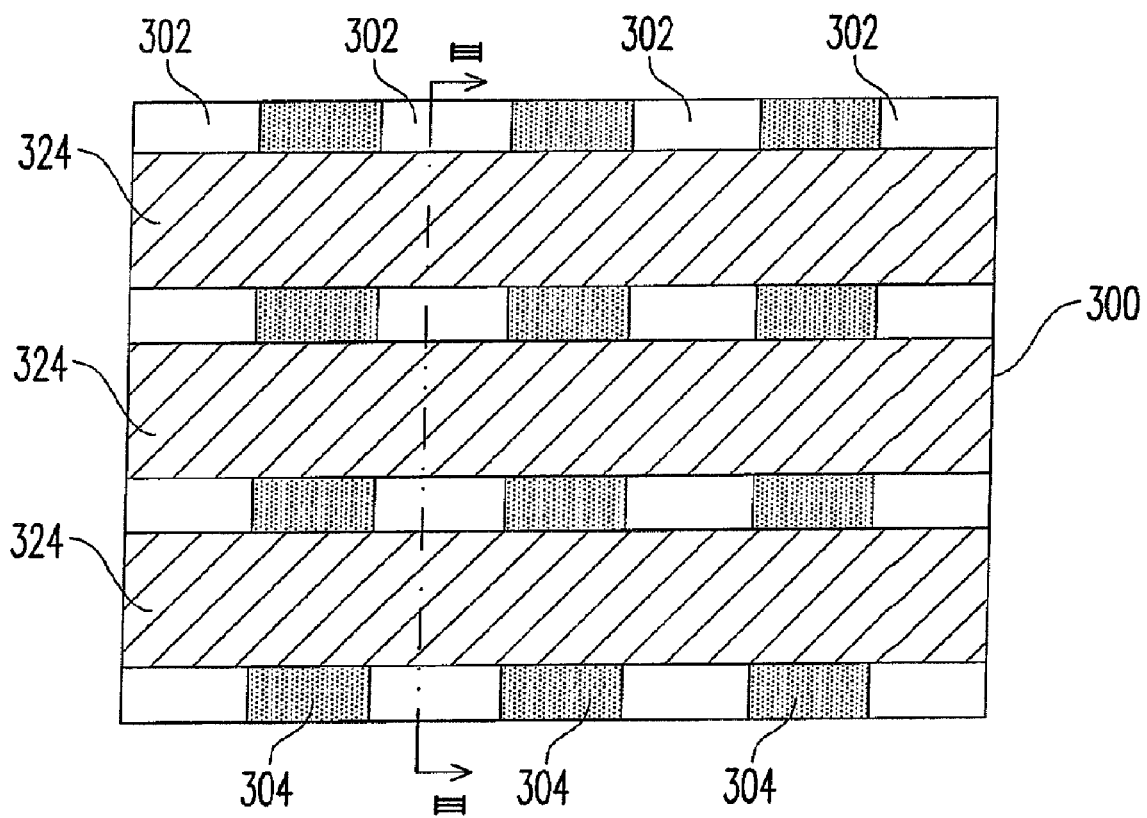
FIG. 3G following

Afterwards, referring to FIG. 3E, the etching process is performed on the mask liner 322 and the mask pattern 320 until the partial surface of the metal silicide layer 318 is exposed.

Then, referring to FIG. 3F, the metal silicide layer 318 and the conductive layer 316 are etched to form a plurality of word lines 324 by utilizing the mask liner 322 and the mask pattern 320 as the mask. Based on the above, a space 328 between the word lines 324 may be further reduced when a pitch 326 stays unchanged. Thereafter, as the protective thin film 122 shown in FIG. 1F, a protective thin film may be alternatively formed respectively on sidewalls of the word lines 324 after the word lines 324 are formed.

Eternally, referring to FIG. 3G after the residual mask liner 322 and the residual mask pattern 324 are removed, the NBit constituted by the charge trapping layers 302, the bit lines 304 and the word lines 324 may be formed if necessary. Further, various designs of the NBits are available at this current state. Therefore, people skilled in the pertinent art may change or adjust shapes, materials, dimensions, or positions of the layers and the components described in the second embodiment based on the actual demands.

In light of the foregoing, a Si and metal composition nearly having a stoichiometric ratio is employed as a material of a silicon metallic layer. Hence, even though the mask liner formed by thermal oxidation is used in the present invention, a metal-Si—O compound causing by additional silicon in the metal silicide layer will not be formed sequentially. That is to say, when the word lines are formed by etching, the metal silicide layer and the conductive layer do not remain between the word lines due to an existence of the metal-Si—O compound, and thus the bridge failure rate between the word lines is not increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming word lines of a memory, the method comprising:
   providing a substrate;
   forming a conductive layer on the substrate;
   forming a metal silicide layer on the conductive layer;
   forming a mask pattern on the metal silicide layer to define a plurality of word line regions and to expose a partial surface of the metal silicide layer;
   forming a mask liner to cover the mask pattern and the surface of the metal silicide layer, so as to shorten distances between the word line regions;
   performing an etching process on the mask liner and the mask pattern until the partial surface of the metal silicide layer is exposed; and
   etching the metal silicide layer and the conductive layer to form a plurality of the word lines, wherein
   a silicon content of the metal silicide layer is less than or equal to 2 for reducing a bridge failure rate between the word lines of the memory.

2. The method of claim 1, wherein the metal silicide layer comprises a WSix layer, a CoSix layer or a TiSix layer.

3. The method of claim 2, wherein the step of forming the metal silicide layer comprises performing a low pressure chemical vapor deposition (LPCVD) process.

4. The method of claim 3, wherein the LPCVD process comprises taking dichlorosilane (DCS) as a source gas of silicon and taking $WF_6$ as a source gas of tungsten.

5. The method of claim 2, wherein the x in the WSix layer ranges from 1.9 to 2.

6. The method of claim 1, wherein a step of forming the mask pattern comprises:
   performing a chemical vapor deposition (CVD) process to form an oxide layer on the metal silicide layer; and
   performing photolithography and etching processes, such that the oxide layer becomes an oxide pattern of the exposed partial surface of the metal silicide layer.

7. The method of claim 1, wherein the step of forming the mask liner comprises performing the LPCVD process to deposit an oxide film when a reactive gas is defined as tetra-ethyl-ortho-silicate (TEOS).

8. The method of claim 1, further comprising respectively forming a protective thin film on sidewalls of the word lines after the word lines are formed.

9. A method of forming word lines of a memory, the method comprising:
   providing a substrate having a conductive layer;
   forming a metal silicide layer on the conductive layer, wherein a silicon content of the metal silicide layer is less than or equal to 2;
   forming a mask pattern on the metal silicide layer to define a plurality of word line regions and to expose a partial surface of the metal silicide layer, wherein forming the mask pattern comprises performing a chemical vapor deposition (CVD) process to form an oxide layer on the metal silicide layer; and performing photolithography and etching processes, such that the oxide layer becomes an oxide pattern of the exposed partial surface of the metal silicide layer;
   forming a plurality of mask liners on sidewalls of the word line regions; and
   etching the metal silicide layer and the conductive layer to form a plurality of the word lines.

10. The method of claim 9, wherein the metal silicide layer comprises a WSix layer, a CoSix layer or a TiSix layer.

11. The method of claim 10, wherein the step of forming the metal silicide layer comprises performing a low pressure chemical vapor deposition (LPCVD) process.

12. The method of claim 11, wherein the LPCVD process comprises taking dichlorosilane (DCS) as a source gas of silicon and taking $WF_6$ as a source gas of tungsten.

13. The method of claim 10, wherein the x in the WSix layer ranges from 1.9 to 2.

14. The method of claim 9, wherein the step of forming the mask liner comprises:
   performing the LPCVD process to deposit an oxide film when a reactive gas is defined as tetra-ethyl-ortho-silicate (TEOS); and
   etching back the oxide film.

* * * * *